United States Patent
Zhang et al.

(10) Patent No.: US 6,383,922 B1
(45) Date of Patent: May 7, 2002

(54) THERMAL STABILITY IMPROVEMENT OF $COSI_2$ FILM BY STUFFING IN TITANIUM

(75) Inventors: Bei Chao Zhang; Chung Woh Lai; Eng Hua Lim; Mei Sheng Zhou; Peter Chew; Arthur Ang, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/872,558

(22) Filed: Jun. 4, 2001

(51) Int. Cl.[7] .................. H01L 21/336; H01L 21/28; H01L 21/44; H01L 21/4763
(52) U.S. Cl. .................. 438/655; 438/299; 438/581; 438/583; 438/630; 438/649; 438/651; 438/661; 438/664
(58) Field of Search .................. 438/630, 648, 438/649, 650, 651, 655, 663, 664, 682, 683, 580, 581, 582, 583, 300, 299, 685, 686, 660, 661

(56) References Cited

U.S. PATENT DOCUMENTS

| | | | |
|---|---|---|---|
| 5,869,396 A | 2/1999 | Pan et al. | 438/647 |
| 6,022,457 A | 2/2000 | Huang et al. | 204/192.17 |
| 6,025,267 A | 2/2000 | Peg et al. | 438/656 |
| 6,083,817 A | 7/2000 | Nogami et al. | 438/586 |
| 6,274,470 B1 * | 8/2001 | Ichimori et al. | 438/592 |

OTHER PUBLICATIONS

Sohn et al, "High Thermal Stability and Low Junction Leakage Current of Ti Capped Co salicide and its Feasibility for High Thermal Budget CMOS devices", Electron Device Meeting, 1998, IEDM's 98 Technical Digest, Internation, Dec. 6, 1998, pp. 1005–1008.*

* cited by examiner

*Primary Examiner*—Chandra Chaudhari
*Assistant Examiner*—Thanhha Pham
(74) *Attorney, Agent, or Firm*—George O. Saile; Rosemary L. S. Pike

(57) ABSTRACT

A method for forming a thermally stable cobalt disilicide film in the fabrication of an integrated circuit is described. A semiconductor substrate is provided having silicon regions to be silicided. A cobalt layer is deposited overlying the silicon regions to be silicided. A capping layer is deposited overlying the cobalt layer. The substrate is subjected to a first rapid thermal anneal whereby the cobalt is transformed to cobalt monosilicide where it overlies the silicon regions and wherein the cobalt not overlying the silicon regions is unreacted. The unreacted cobalt layer and the capping layer are removed. A titanium layer is deposited overlying the cobalt monosilicide layer. Thereafter the substrate is subjected to a second rapid thermal anneal whereby the cobalt monosilicide is transformed to cobalt disilicide. The titanium layer provides titanium atoms which diffuse into the cobalt disilicide thereby increasing its thermal stability. The titanium layer is removed to complete formation of a thermally stable cobalt disilicide film in the manufacture of an integrated circuit.

21 Claims, 4 Drawing Sheets

THERMAL STABILITY IMPROVEMENT OF COSI₂ FILM BY STUFFING IN TITANIUM

BACKGROUND OF THE INVENTION

(1) Field of the Invention

The invention relates to the fabrication of integrated circuit devices, and more particularly, to a method of forming a thermally stable cobalt silicide film in the fabrication of integrated circuits.

(2) Description of the Prior Art

Cobalt disilicide ($CoSi_2$) is a preferred salicide technology as CMOS device sizes shrink to 0.18 $\mu$m and beyond because of its good performance with small polysilicon and active area line widths. Cobalt disilicide also has been widely accepted in deep sub-micron devices to reduce the contact resistance. As device scales shrink further and molecular processes evolve, the requirement for cobalt disilicide film properties becomes more stringent. One of the concerns over the cobalt disilicide ($CoSi_2$) film properties is its thermal stability. It is known that the thermal stability of $CoSi_2$ is thickness dependent. That is, the thinner the $CoSi_2$ film, the more thermally unstable it becomes. The sheet resistance of the thin $CoSi_2$ film could be increased significantly when it experiences a thermal stress in subsequent processing. On the other hand, for shallow junctions, the $CoSi_2$, thickness must be decreased. Thus, the $CoSi_2$ film thermal stability for thin films must be improved.

A number of patents disclose methods of forming $CoSi_2$. U.S. Pat. No. 6,022,457 to Huang et al discloses cleaning the native oxide layer off the silicon substrate, then depositing a titanium layer under the cobalt layer. A silicon layer may be deposited over the titanium layer and under the cobalt layer. A RTA process forms $CoSi_2$. U.S. Pat. No. 6,083,817 to Nogami et al teaches a tungsten nitride capping layer over the cobalt layer. U.S. Pat. No. 6,025,267 to Pey et al discloses a titanium nitride layer over the cobalt. U.S. Pat. No. 5,869,396 to Pan et al shows a method of forming cobalt disilicide.

SUMMARY OF THE INVENTION

A principal object of the present invention is to provide an effective and very manufacturable method of fabricating a cobalt disilicide film in the fabrication of an integrated circuit.

A further object of the invention is to provide a method of fabricating a thermally stable cobalt disilicide film in the fabrication of an integrated circuit.

Yet another object is to provide a method of forming a thermally stable cobalt disilicide film by using a titanium stuffing technique.

In accordance with the objects of the invention a method for forming a thermally stable cobalt disilicide film in the fabrication of an integrated circuit is achieved. A semiconductor substrate is provided having silicon regions to be silicided. A cobalt layer is deposited overlying the silicon regions to be silicided. A capping layer is deposited overlying the cobalt layer. The substrate is subjected to a first rapid thermal anneal whereby the cobalt is transformed to cobalt monosilicide where it overlies the silicon regions and wherein the cobalt not overlying the silicon regions is unreacted. The unreacted cobalt layer and the capping layer are removed. A titanium layer is deposited overlying the cobalt monosilicide layer. Thereafter the substrate is subjected to a second rapid thermal anneal whereby the cobalt monosilicide is transformed to cobalt disilicide. During this transformation, some titanium atoms diffuse into and are incorporated into the cobalt disilicide film. The titanium layer is removed to complete formation of a thermally stable cobalt disilicide film in the manufacture of an integrated circuit.

BRIEF DESCRIPTION OF THE DRAWINGS

In the accompanying drawings forming a material part of this description, there is shown.

DESCRIPTION OF THE PREFERRED EMBODIMENTS

The process of the present invention can be used in any application in which it is desired to form a cobalt disilicide film overlying a silicon region. The process of the invention will be described for the application in which $CoSi_2$ is formed overlying a gate electrode and source and drain regions. It is to be understood that the invention is not limited to the application so illustrated.

Figure 1:
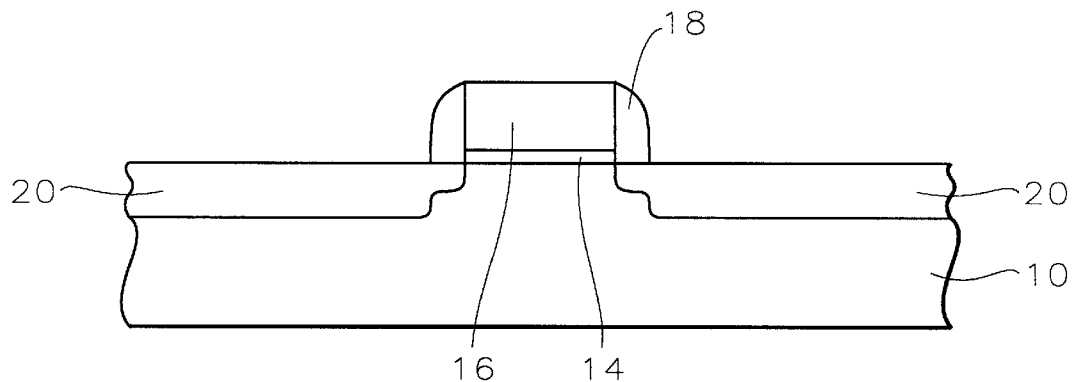
FIGS. 1 through 7 schematically illustrate in cross-sectional representation a preferred embodiment of the present invention.

Referring now more particularly to FIG. 1, there is shown an illustration of a portion of a partially completed integrated circuit. The semiconductor substrate 10 is preferably composed of silicon having a (100) crystallographic orientation. Gate electrode 16 and source and drain regions 20 are formed in and on the semiconductor substrate as is conventional in the art. For example, gate electrode 16 has been formed overlying a gate oxide layer 14. Sidewall spacers, such as silicon oxide, 18 are formed on the gate. Source and drain regions are n-type or p-type, depending on the type of device to be fabricated.

Figure 2:
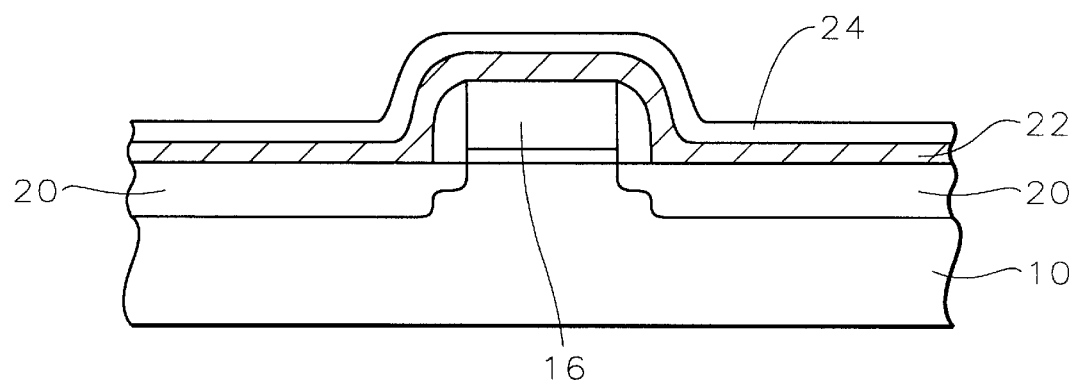

As shown in FIG. 2, a layer of cobalt 22 is sputter deposited over the surface of the substrate and the gate electrode to a thickness of between about 50 and 150 Angstroms. Next, a capping layer of titanium or titanium nitride 24 is deposited over the cobalt layer to a thickness of between about 50 and 200 Angstroms. The titanium or titanium nitride capping layer will prevent any foreign contaminant invasion during the first annealing process.

Figure 3:
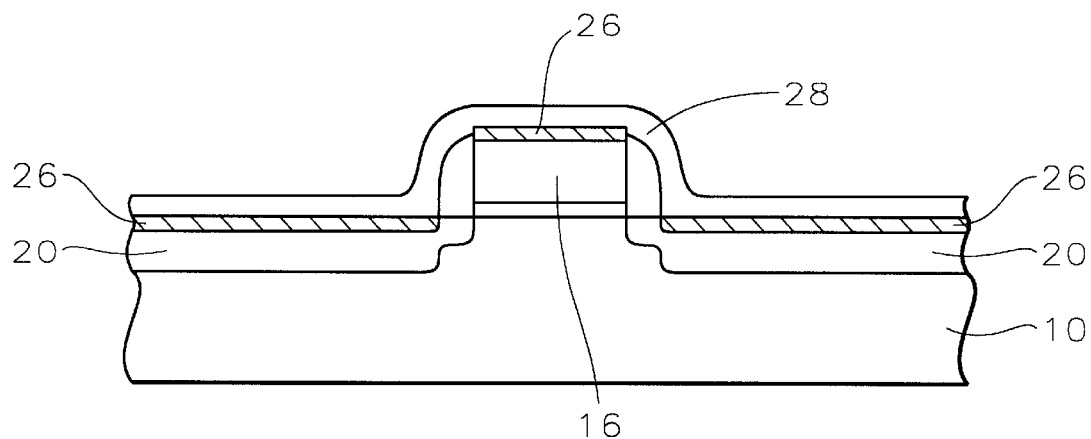

Now, the wafer is subjected to a first rapid thermal annealing (RTA) at a temperature of between about 450 and 650° C. for 15 to 90 seconds. This annealing will form cobalt monosilicide (CoSi) 26 over the gate electrode and over the source and drain regions, as shown in FIG. 3. Layer 28 contains unreacted cobalt and titanium or titanium nitride residue.

Figure 4:
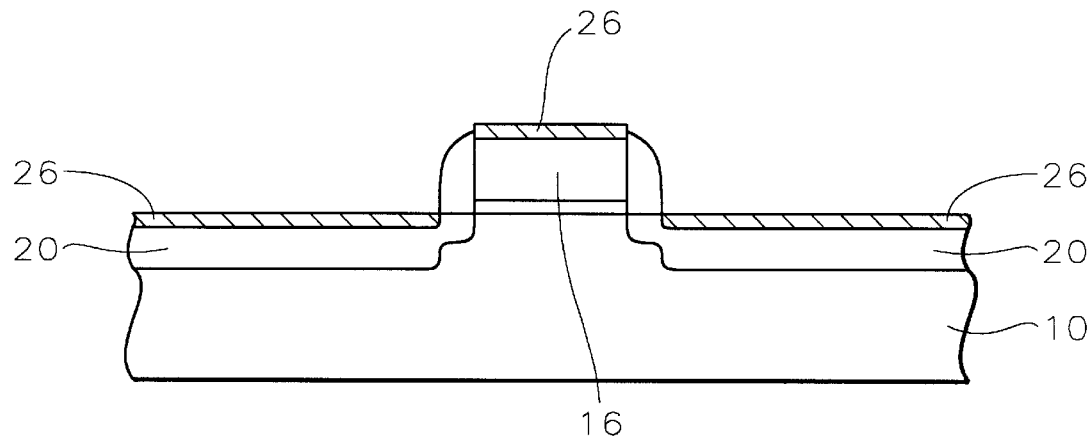

The unreacted cobalt and titanium residue layer is etched back from the wafer surface, leaving the CoSi film 26 over the gate electrode 16 and the source and drain regions 20, as shown in FIG. 4.

Figure 5:
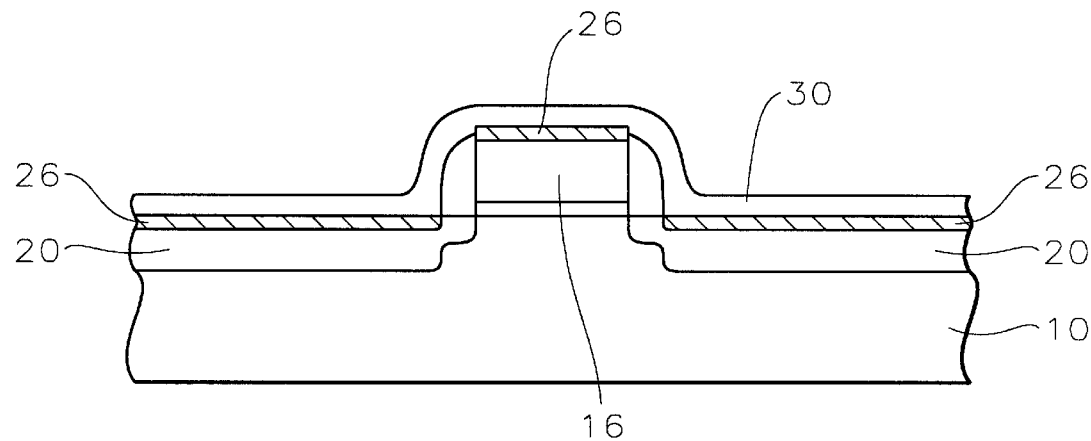

Now, in a key step, a layer of titanium 30 is deposited over the silicided gate electrode and source and drain regions to a thickness of between about 50 and 200 Angstroms, as shown in FIG. 5.

Figure 6:
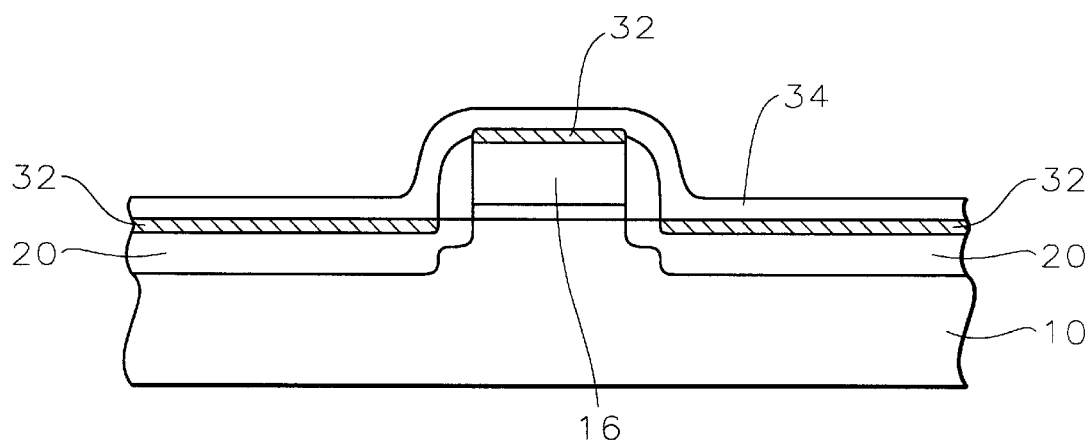

To complete the low resistance cobalt silicide film formation, the wafer is subjected to a second RTA, this time at a temperature of between about 700 and 900° C., to transform the cobalt monosilicide (CoSi) to cobalt disilicide (CoSi$_2$) 32, as illustrated in FIG. 6. During this RTA, some of the titanium atoms from the titanium layer 30 will diffuse into the cobalt disilicide film 32, thus increasing the thermal stability of the cobalt disilicide.

Figure 7:
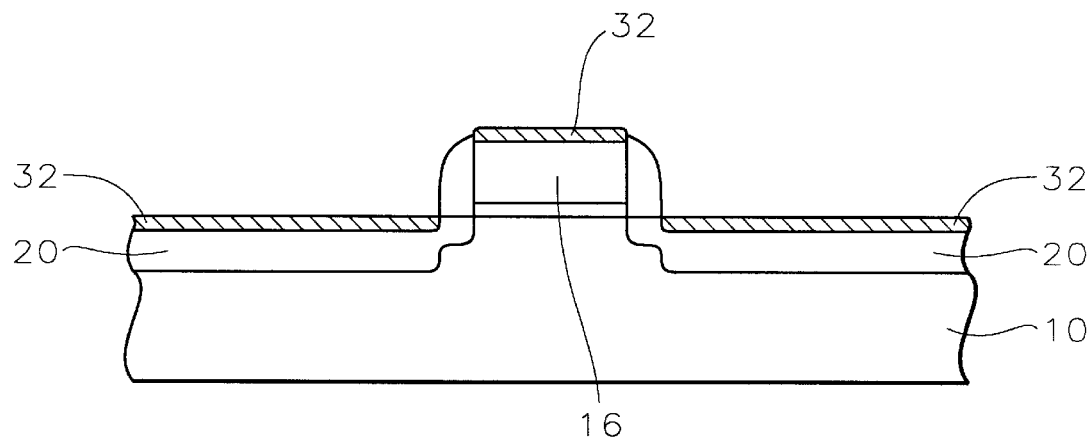

The titanium residue 34 remains overlying the CoSi$_2$ layer 32. A second etchback removes the titanium residue, leaving the completed silicided gate and source and drain regions, as shown in FIG. 7.

Figure 8:
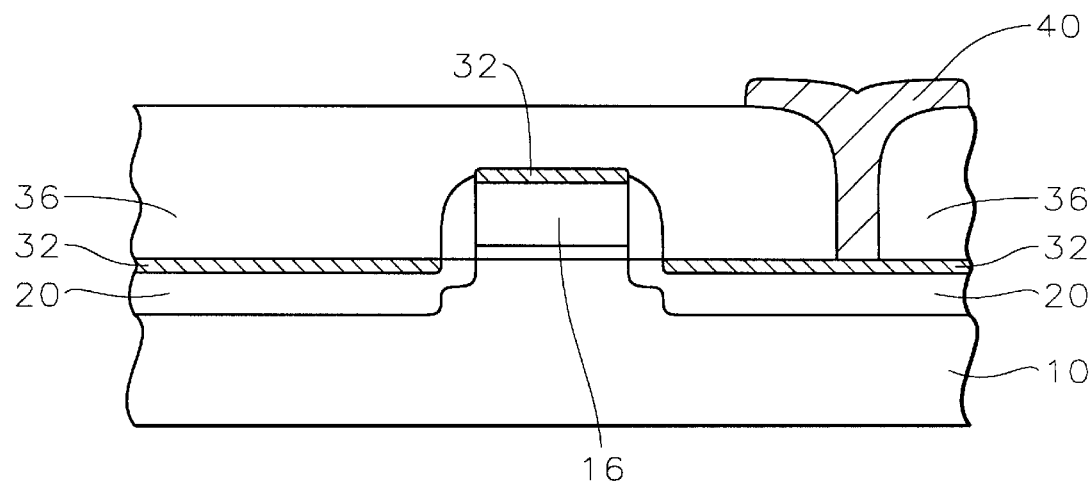
FIG. 8 schematically illustrates in cross-sectional representation a completed integrated circuit fabricated according to a preferred embodiment of the present invention.

Standard backend processing continues as is conventional to complete the integrated circuit. For example, FIG. 8 shows a thick dielectric layer 36 covering the silicided gate and source and drain regions. Electrical connections may be made, for example, to one of the silicided source/drain regions 20 by metal contact 40, as shown.

EXAMPLE

The following Example is given to show the important features of the invention and to aid in the understanding thereof. Variations may be made by one skilled in the art without departing from the spirit and scope of the invention.

The process of the present invention has been implemented. Experiments were performed in which cobalt disilicide films were formed using the process of the invention in which a first titanium overlayer was formed over a cobalt layer, a first RTA was performed and the unreacted residue was removed, a second titanium layer of 50 to 200 Angstroms was formed over the cobalt monosilicide, and a second RTA was performed followed by removal of the titanium residue. A control was made using a standard process in which a first titanium overlayer was formed over a cobalt layer, a first RTA was performed and the unreacted residue was removed and a second RTA was performed.

Sheet resistance (Rs) and its non-uniformity (RsU) increments were measured for each of the samples after thermally annealing the samples ten times at 850° C. for 30 seconds (to provide thermal stress). For the standard process, the change in sheet resistance was an increase of about 33.6% while the change in sheet resistance non-uniformity was an increase of about 125.9%. For the process of the present invention, the change in sheet resistance was an increase of about 4.3% and the change in sheet resistance non-uniformity was an increase of about 3.7%. Because of the titanium stuffing process of the present invention, film sheet resistance is not affected significantly.

Figure 9:
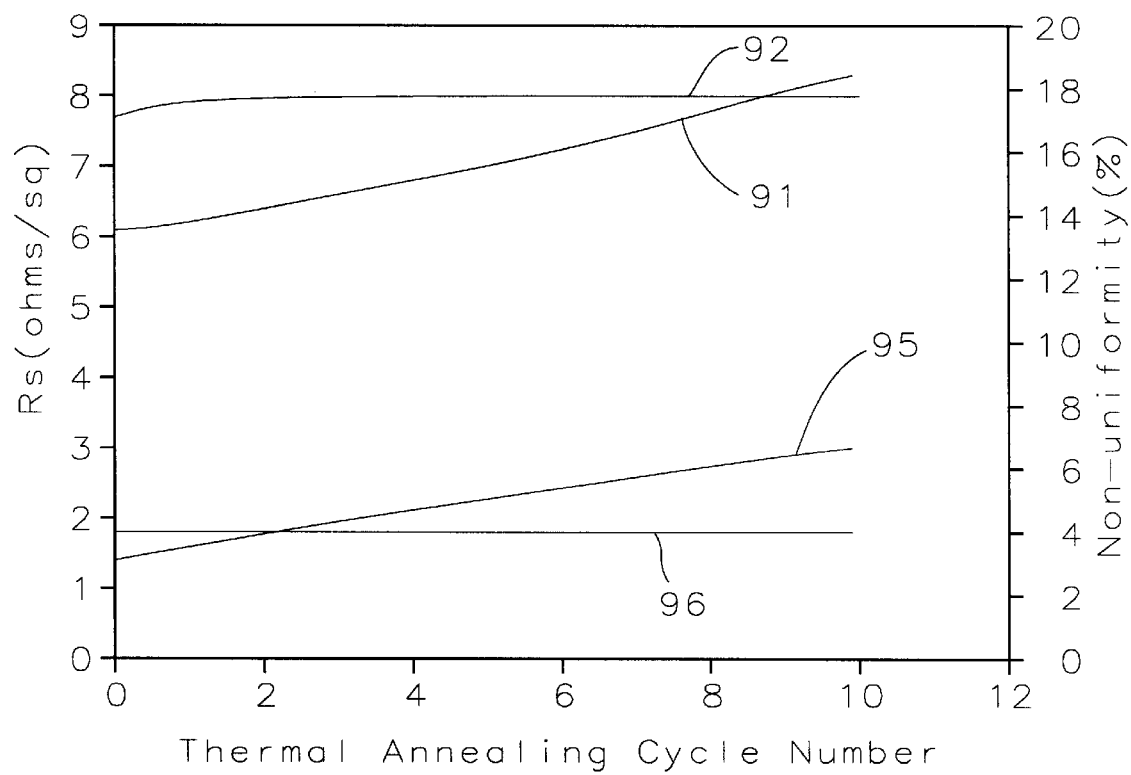
FIG. 9 graphically illustrates both resistance and non-uniformity as functions of thermal cycles for samples made according to a standard process and according to the process of the present invention.

FIG. 9 graphically illustrates the results of the thermal stress testing described above. Thermal annealing cycle numbers are shown on the horizontal axis. Line 91 shows the resistance (on the lefthand axis) of the sample made by the standard process as thermal cycles increase. Line 92 shows the resistance of the sample made by the process of the invention.

Line 95 shows the non-uniformity (on the righthand axis) of the sample made by the standard process as thermal cycles increase. Line 96 shows the non-uniformity of the sample made by the process of the invention.

The process of the invention provides an effective method of forming CoSi$_2$ especially for shallow junctions and small feature sizes by use of a titanium layer over the cobalt monosilicide during the second RTA that forms cobalt disilicide. This titanium layer provides a titanium atom source which diffuses into the cobalt disilicide film thereby forming a cobalt disilicide having greater thermal stability and, therefore, much lower sheet resistance than conventional cobalt disilicide layers. The process of the invention is especially useful for thin silicide layers required for shallow junctions.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a cobalt disilicide film in the manufacture of an integrated circuit comprising:

providing a semiconductor substrate having silicon regions to be silicided;

depositing a cobalt layer overlying said silicon regions to be silicided;

depositing a capping layer overlying said cobalt layer;

subjecting said semiconductor substrate to a first rapid thermal anneal whereby said cobalt is transformed to cobalt monosilicide where it overlies said silicon regions and wherein said cobalt not overlying said silicon regions is unreacted;

removing said unreacted cobalt layer and said capping layer;

depositing a titanium layer overlying said cobalt monosilicide layer;

thereafter subjecting said semiconductor substrate to a second rapid thermal anneal whereby said cobalt monosilicide is transformed to cobalt disilicide wherein titanium atoms from said titanium layer diffuse into said cobalt disilicide thereby increasing thermal stability of said cobalt disilicide; and removing said titanium layer to complete formation of said cobalt disilicide film in the manufacture of said integrated circuit.

2. The method according to claim 1 wherein said silicon regions to be silicided comprise gate electrodes and associated source and drain regions.

3. The method according to claim 1 wherein said cobalt layer is sputter deposited to a thickness of between about 50 and 150 Angstroms.

4. The method according to claim 1 wherein said capping layer comprises titanium sputter deposited to a thickness of between about 50 and 200 Angstroms.

5. The method according to claim 1 wherein said capping layer comprises titanium nitride sputter deposited to a thickness of between about 50 and 200 Angstroms.

6. The method according to claim 1 wherein said first rapid thermal anneal is performed at a temperature of between about 450 and 650° C.

7. The method according to claim 1 wherein said titanium layer is sputter deposited to a thickness of between about 50 and 200 Angstroms.

8. The method according to claim 1 wherein said second rapid thermal anneal is performed at a temperature of between about 700 and 900° C.

9. A method of fabricating a cobalt disilicide film in the manufacture of an integrated circuit comprising:

providing a semiconductor substrate having silicon regions to be silicided;

depositing a cobalt layer overlying said silicon regions to be silicided wherein said cobalt layer has a thickness of between 50 and 200 Angstroms;

depositing a capping layer overlying said cobalt layer wherein sad capping layer is selected from a group consisting of titanium and titanium nitride;

subjecting said semiconductor substrate to a first rapid thermal anneal whereby said cobalt is transformed to cobalt monosilicide where it overlies said silicon regions and wherein said cobalt not overlying said silicon regions is unreacted;

removing said unreacted cobalt layer and said capping layer;

depositing a titanium layer overlying said cobalt monosilicide layer;

thereafter subjecting said semiconductor substrate to a second rapid thermal anneal whereby said cobalt monosilicide is transformed to cobalt disilicide wherein titanium atoms from said titanium layer diffuse into said cobalt disilicide thereby increasing thermal stability of said cobalt disilicide; and removing said titanium layer to complete formation of said cobalt disilicide film in the manufacture of said integrated circuit.

10. The method according to claim 9 wherein said silicon regions to be silicided comprise gate electrodes and associated source and drain regions.

11. The method according to claim 9 wherein said capping layer is sputter deposited to a thickness of between about 50 and 200 Angstroms.

12. The method according to claim 9 wherein said first rapid thermal anneal is performed at a temperature of between about 450 and 650° C.

13. The method according to claim 9 wherein said titanium layer is sputter deposited to a thickness of between about 50 and 200 Angstroms.

14. The method according to claim 9 wherein said second rapid thermal anneal is performed at a temperature of between about 700 and 900° C.

15. A method of fabricating a cobalt disilicide film in the manufacture of an integrated circuit comprising:

providing a semiconductor substrate having silicon regions to be silicided;

depositing a cobalt layer overlying said silicon regions to be silicided wherein said cobalt layer has a thickness of between 50 and 200 Angstroms;

depositing a capping layer overlying said cobalt layer;

subjecting said semiconductor substrate to a first rapid thermal anneal whereby said cobalt is transformed to cobalt monosilicide where it overlies said silicon regions and wherein said cobalt not overlying said silicon regions is unreacted;

removing said unreacted cobalt layer and said capping layer;

depositing a titanium layer overlying said cobalt monosilicide layer;

thereafter subjecting said semiconductor substrate to a second rapid thermal anneal whereby said cobalt monosilicide is transformed to cobalt disilicide wherein titanium atoms from said titanium layer diffuse into said cobalt disilicide thereby increasing thermal stability of said cobalt disilicide; and removing said titanium layer to complete formation of said cobalt disilicide film in the manufacture of said integrated circuit.

16. The method according to claim 15 wherein said silicon regions to be silicided comprise gate electrodes and associated source and drain regions.

17. The method according to claim 15 wherein said capping layer comprises titanium sputter deposited to a thickness of between about 50 and 200 Angstroms.

18. The method according to claim 15 wherein said capping layer comprises titanium nitride sputter deposited to a thickness of between about 50 and 200 Angstroms.

19. The method according to claim 15 wherein said first rapid thermal anneal is performed at a temperature of between about 450 and 650° C.

20. The method according to claim 15 wherein said titanium layer is sputter deposited to a thickness of between about 50 and 200 Angstroms.

21. The method according to claim 15 wherein said second rapid thermal anneal is performed at a temperature of between about 700 and 900° C.

* * * * *